United States Patent [19]

Kang et al.

[11] Patent Number: 5,068,200

[45] Date of Patent: Nov. 26, 1991

[54] METHOD OF MANUFACTURING DRAM CELL

[75] Inventors: Laegu Kang; Kyungtae Kim, both of Seoul, Rep. of Korea

[73] Assignee: Samsung Electronics Co., Ltd., Rep. of Korea

[21] Appl. No.: 490,326

[22] Filed: Mar. 8, 1990

[30] Foreign Application Priority Data

Jun. 13, 1989 [KR] Rep. of Korea .............. 89-8100

[51] Int. Cl.$^5$ ............................................. H01L 21/70
[52] U.S. Cl. ........................................ 437/52; 437/40; 437/41; 437/47; 437/60; 437/191; 437/919
[58] Field of Search ................ 437/40, 47, 52, 60, 437/195, 228, 40, 41, 29, 41, 191, 162; 357/23.6, 51, 54

[56] References Cited

U.S. PATENT DOCUMENTS

| | | | |
|---|---|---|---|
| 3,942,241 | 3/1976 | Harigaya et al. | 437/162 |
| 4,364,166 | 12/1982 | Crowder et al. | 437/162 |
| 4,378,627 | 4/1983 | Jambotkar | 437/41 |
| 4,419,810 | 12/1983 | Riseman | 437/41 |
| 4,488,162 | 12/1984 | Jambotkar | 437/41 |
| 4,505,027 | 3/1985 | Schwabe et al. | 437/41 |
| 4,649,406 | 3/1987 | Takemae et al. | 357/23.6 |
| 4,764,481 | 8/1988 | Alui et al. | 437/41 |
| 4,845,046 | 7/1989 | Shimbo | 437/41 |
| 4,855,801 | 8/1989 | Kuesters | 357/23.6 |
| 4,905,064 | 2/1990 | Yabu et al. | 357/23.6 |
| 4,907,046 | 3/1990 | Ohji et al. | 357/23.6 |
| 4,994,563 | 12/1988 | Maeda | 357/23.6 |

FOREIGN PATENT DOCUMENTS

| | | | |
|---|---|---|---|
| 0175769 | 10/1984 | Japan | 437/40 |
| 10137869 | 6/1987 | Japan | 437/40 |
| 0038252 | 2/1988 | Japan | 357/23.6 |
| 0133565 | 6/1988 | Japan | 357/23.6 |
| 0281457 | 11/1988 | Japan | 357/23.6 |

Primary Examiner—Brian E. Hearn
Assistant Examiner—Tom Thomas

[57] ABSTRACT

This invention relates to a method of manufacturing a DRAM cell which has a stacked capacitor and forming drain and source polycrystalline silicon regions on surface of a semiconductor substrate. The invention is directed to: a first step for forming a field oxide film and channel stopper as well as a polycrystalline silicon oxide film doped with impurities; a second step for dividing said silicon into a drain and source polycrystalline silicon region and forming a gate oxide film between the two silicon regions simultaneously with the drain and source diffusion regions and a gate electrode on the gate nitride film; a third step for forming an insulating film on the upper surface of the nitride film and a window on the source polycrystalline silicon region, a storage poly contacting with the same through the window; a fourth step for forming a dielectric layer and a plate poly of the stacked capacitor; and a fifth step forming another insulating film thereon and forming a window on the drain polycrystalline silicon region and also forming a bit line contacting with the exposed drain polycrystalline silicon region through that window. This invention can prevent the generation of leakage current resulting from the damage caused by the drain and source diffusion polycrystalline silicon regions when an etching process is used for the formation of the storage poly and the bit line.

1 Claim, 2 Drawing Sheets

METHOD OF MANUFACTURING DRAM CELL

BACKGROUND OF THE INVENTION

The present invention relates to a method of manufacturing a stacked capacitor DRAM cell, and more particularly, to a method of manufacturing a stacked capacitor DRAM cell for forming drain and source polycrystalline silicon on the surface of a substrate.

DRAM (dynamic random access memory) cells are constructed with one transistor in which the drain-source path is connected between a bit line and a cell node, and a storage capacitor which is connected between the cell node and cell plate. As the memory capacity of DRAM devices have increased thereby increasing the DRAM memory density, the size of the memory cells have decreased. In order to maximize the capacity of the storage capacitor with respect to the very limited predetermined area occupied by the DRAM cell, DRAM cell having a three-dimensional capacitor structure, such as, the trench structure and the stacked structure have been developed. Storage capacitors having the trench structure are formed within a groove formed in semiconductor substrate. Storage capacitors having a stacked structure are formed on the semiconductor substrate. A DRAM cell of the stacked capacitor type is easier to manufacture than a DRAM cell of trench capacitor type. Moreover, the stacked capacitor DRAM cell does not include the electrical problems of the trench capacitor type DRAM, such as, leakage and punch-through between one trench and another trench.

FIG. 1 shows a cross sectional view of a conventional stacked capacitor type/DRAM memory cell, the manufacturing method for this DRAM cell will now be explained briefly.

P-type well 2 is formed on P-type substrate 1. A field oxide film layer 4 is formed for isolation between memory cells, and a P+ channel stopper layer 3 is formed under the field oxide film 4. Then, gate oxide film 5 is formed, and doped polycrystalline silicon 6 which forms an electrode of the switching transistor of the memory cell is formed on the gate oxide film 5. At the same time, polycrystalline silicon 7 connected with gate electrode of memory cell being contiguous to the top portion of said field oxide film (4) is formed. Thereafter, an N+ source region 8 and an N+ drain region 9 of switching transistor are formed, and an insulating layer 10 is formed for isolation between said polycrystalline silicon regions 6, 7. Doped storage poly 11 which contacts with selected portion of said source region 8 and forming an electrode of storage capacitor is formed on said polycrystalline silicon regions 6, 7. Dielectric layer 12 of said storage capacitor is formed on the surface of said storage poly 11, and a doped plate poly 13 forming another electrode of said storage capacitor is formed. An insulating film 14 is formed on said plate poly 13, and electrically conductive film 15 which contacts with said drain region 9 and comes to be a bit line is formed.

However, the above-described conventional stacked capacitor cell has had some defects that in case of the insulating film on the source and drain regions being etched in order to form the storage poly and bit line, the said regions get damaged and leakage current is produced.

SUMMARY OF THE INVENTION

Accordingly, it is an object of the present invention to provide a method of manufacturing a stacked capacitor DRAM cell capable of obviating the generation of leakage current resulting from the contact of bit line and storage poly by forming source and drain polycrystalline silicons implanted with impurities on the surface of a substrate.

In order to accomplish the above-described object, a method of manufacturing DRAM cell having stacked capacitor of the present invention is constituted as follows:

the first process for forming a first and a second field oxide films on the semiconductor substrate of first conductive type, at the same time, forming a channel stopper of said first conductive type on the lower portion of the first field oxide film and a polycrystalline silicon doped with impurities of a second conductive type of the opposite conductive type to the first conductive type;

the second process for dividing said polycrystalline silicon into drain and source polycrystalline silicon regions, and forming a gate oxide film on the surface of substrate between said drain and source polydrystalline silicon regions, at the same time, forming drain and source diffusion regions of the second conductive type and a gate on the top portion of gate nitride film;

the third process for forming a first insulating film on the whole upper surface of said nitride film and gate, and forming a window at a predetermined portion of the top portion of said source polycrystalline silicon and a storage poly contacting with source polycrystalline silicon exposed through said window;

the fourth process for forming a dielectric layer that becomes a dielectric substance of the stacked capacitor and a plate poly on the top portion of said storage poly; and the fifth process for forming a second insulating film on the top portion of said first insulating film and plate poly and forming a window at a predetermined portion of the top portion of said drain region, and also forming the bit line contacting with the drain region exposed through said window.

In addition, in order to attain the above-described object, the present invention is constituted with a method for manufacturing DRAM cell characterized in that the bit line is contacted with the drain polycrystalline silicon superposed with the second field oxide film.

BRIEF DESCRIPTION OF THE DRAWINGS

The above and further objects as well as advantages of the present invention will become clear by the following description of a preferred embodiment of the invention with reference to the accompanying drawings, wherein.

Throughout the drawings, like reference numerals and symbols are used for designating like or equivalent parts or portions, for simplicity of illustration and explanation.

DETAILED DESCRIPTION OF THE INVENTION

Hereinafter, a preferred embodiment of the present invention will be described in detail with reference to the accompanying drawings.

FIGS. 2(A) to 2(E) are process diagrams of stacked capacitor DRAM cell of a preferred embodiment of the present invention.

Figure 1:
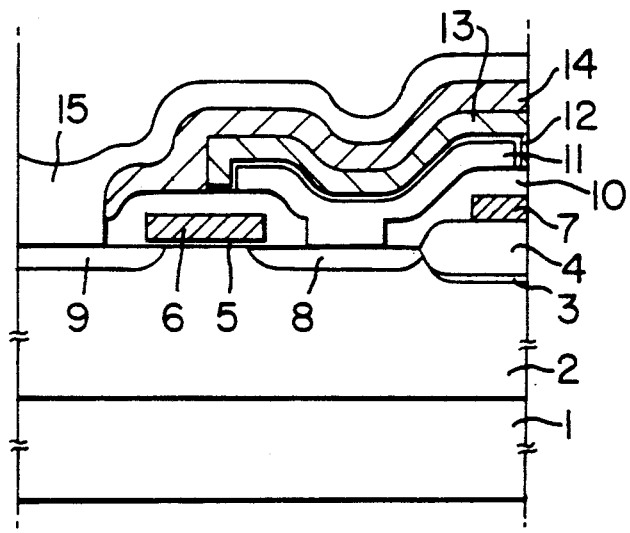
FIG. 1 is a cross sectional view of a conventional stacked capacitor DRAM cell.
Figure 2A:
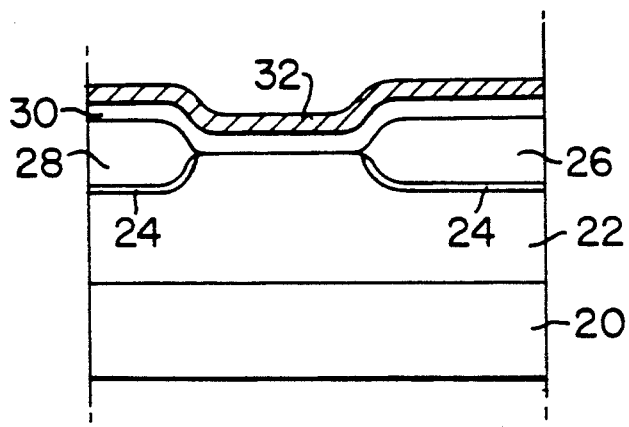
FIGS. 2(A) to 2(E) are process diagrams of a stacked capacitor DRAM cell according to the present invention.

Referring to FIG. 2(A), P-type well region 22 having a density of about $10^{16}$ ion/cm$^3$ and depth of about 4 μm is formed on P-type substrate 20 having a resistance of about 18 ohms-cm and an orientation of <100>.

Thick first and second field oxide films 26, 28 are formed by LOCOS (Local Oxidation of Silicon) method according to the normal manufacturing method of N-channel MOS transistor. Said first field oxide film 26 and second field oxide film 28 are for making element separation, under which P-channel stopper 24 is formed. Then, polycrystalline silicon 30 of a thickness of about 1000–1500 Å is deposited in the whole top surface of the semiconductor substrate 20 and the first and second field oxide films 26, 28, and thereafter. An arsenic substance (As) is ion-implanted with energy of 50 KeV and Dose of $5 \times 10^{15}$ ion/cm$^2$. At this moment, said polycrystalline silicon 30 becomes to have a resistance of 35–40 ohms/sqr. Thereafter, a nitride film 32 of a thickness of about 1500–2000 Å is formed by CVD (Chemical Vapor Deposition) process on the top portion of said polycrystalline silicon 30.

Figure 2B:
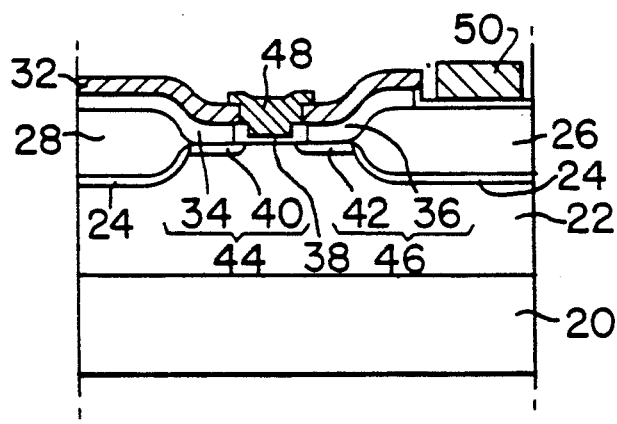

Referring to FIG. 2(B), said nitride film 32 and polycrystalline silicon 30 are etched by the typical photolithographic method. Hereupon, said polycrystalline silicon 30 is divided into a drain polycrystalline silicon 34 and a source polycrystalline silicon 36, and said drain polycrystalline silicon 34 is formed over the second field oxide film 28, and the source polycrystalline silicon 36 is formed on the upper portion of the first field oxide film 26.

Thereafter, a gate oxide film 38 of a thickness of about 150–200 Å is formed on the substrate exposed by usual heating oxidation method. Hereupon, the arsenic substance (As) that has been doped at said drain and source polycrystalline silicon regions 34, 36 is diffused to the P-well region 22, and drain and source diffusion regions 40, 42 are formed, and the exposed side surface is also oxidized. Said drain and source polycrystalline silicon regions 34, 36 as well as said drain and source diffusion regions 40, 42 are respectively utilized as drain 44 and source 46. After polycrystalline silicon of a thickness of about 2000–2500 Å is deposited, doped with POCl3, and then ion-implanted on the whole surface of the nitride film and oxide film 32, 38, gates 48, 50 are formed on the upper portion of gate oxide film 38 by photo-etching method. Said gates 48, 50 are utilized as word line, and the gate 50 of the upper portion of the first field oxide film 26 becomes a gate electrode of adjacent elements.

Figure 2C:
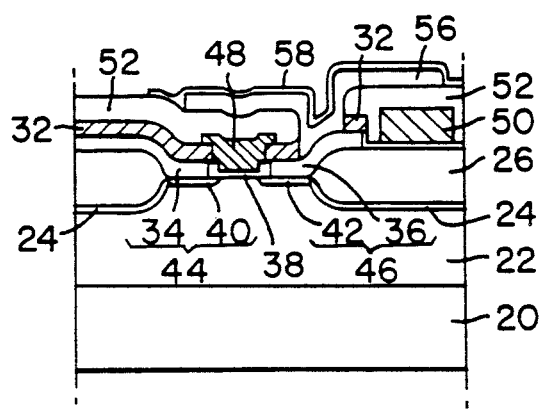

Referring to FIG. 2(C), a first insulating film 52 of a thickness of about 3000–4000 Å is formed on said nitride film and oxide film 32, 38 and gates 48, 50, and a window 54 is formed by etching the nitride film 32 and a first insulating film 52 on said source polycrystalline silicon 36. Hereupon the window 54 is formed on the first field oxide film 26. Since said window 54 is formed on the source polycrystalline silicon 36, damaging the source diffusion region 42 by etching process can be prevented.

Figure 2E:
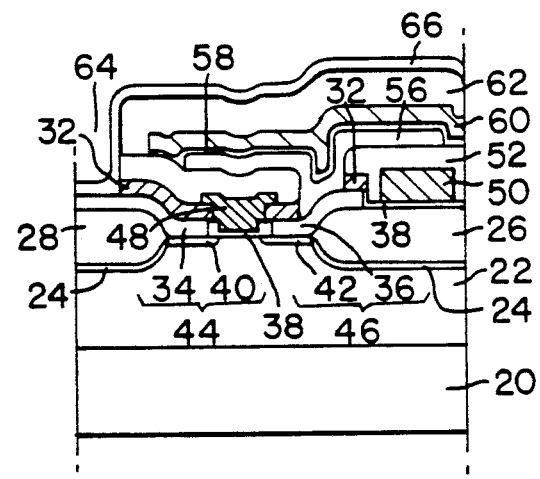
Figure 2D:
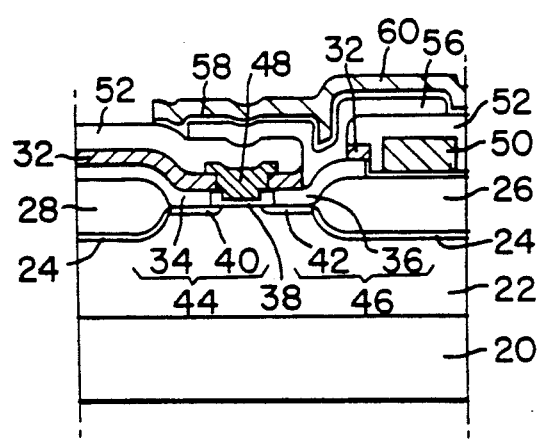

Referring to FIG. 2(D), after an N+ doped polycrystalline silicon of a thickness of about 1000–1500 Å is deposited on said first insulating film 52 and the exposed source polycrystalline silicon 36, storage poly 56 becoming an electrode of capacitor is formed by etching selectively. A dielectric layer 58 of thickness of about 80–120 Å is formed on said storage poly 56 and second oxide film 52, and the N+ doped polycrystalline silicon of thickness of about 1500–1700 Å is deposited on said dielectric layer 58 and then a plate poly 60 becoming another electrode of capacitor is formed by etching selectively. Wherein said dielectric layer 58 can be an oxide film or an ONO film, and it functions as a dielectric substance of stacked capacitor.

Referring FIG. 2(E), after a third oxide film 62 is formed on the whole surface of aforementioned structure and then a predetermined portion of the drain polycrystalline silicon 34 on said second field oxide film 28 is exposed by photolithographic method and a window 64 is formed, a bit line 66 contacting with said drain polycrystalline silicon 40 is selectively formed. In the above description, when the window 64 for contacting the bit line 66 and the drain polycrystalline silicon 34 is formed on the second field oxide film 28, the drain polycrystalline silicon 34 prevents the drain diffusion region 40 from being damaged by the etching process. In addition, said bit line 66 may be either silicide of W or Ti, or the polycrystalline silicon.

Figure 3:
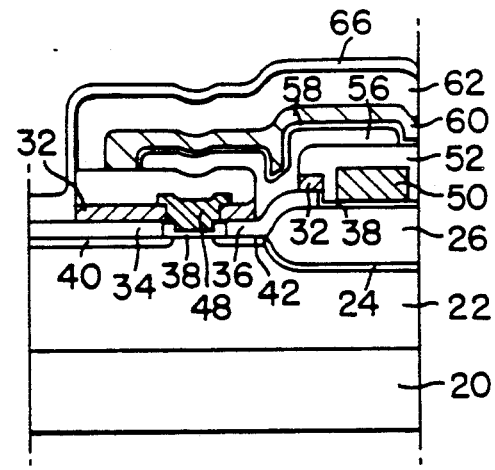
FIG. 3 is a cross sectional view of the stacked capacitor DRAM cell of a preferred embodiment according to the present invention.

FIG. 3 is a cross sectional view of stacked capacitor DRAM cell formed by the embodiment according to the present invention, in which same reference numbers above-used are applied to identical parts or structure with FIGS. 2(A) to 2(B).

Referring to FIG. 3, an active region is defined by forming a channel stopper 24 and a field oxide film 26 for the separation, between elements on P-well region 22 on P-type substrate 20. Hereupon, a field oxide film is not formed within the active region. Thereafter, the polycrystalline silicon and the nitride film 32 are formed on the active region, and the drain and source polycrystalline silicons 34, 36 are formed respectively by dividing said polycrystalline silicon. Then, when a gate oxide film 38 is grown, the arsenic substance (As) that has been doped to said drain and source polycrystalline silicon regions 34, 36 are diffused to P-well region 22 and thus a drain and a source diffusion regions 40, 42 are formed. Source polycrystalline silicons 34, 36 as well as said drain and source diffusion regions 40, 42 are respectively utilized as drain 44 and source 46. Thereafter, gates 48, 50 utilized as a word line are formed on the top portion of the gate oxide film 38, and the first insulating film 52 is formed on said gates 48, 50 and nitride film 32. Wherein said gate 50 on the field oxide film 26 becomes a gate of the adjacent elements. Then, a window is formed on the nitride film and first insulating films 32, 52 on said source polycrystalline silicon 36, and a predetermined portion of said source polycrystalline silicon 36 is exposed whereby the storage poly 56 is deposited. Then, the dielectric layer 58 and the plate 60 are sequentially formed on said storage poly 56, where the dielectric layer 58 formed with oxide film or ONO film is utilized as a dielectric substance of the stacked capacitor, and storage poly 54 and plate poly 54 and plate poly 60 are utilized as electrode of the capacitor. Thereafter, second insulating film 62 is formed on the whole surface of aforementioned structure, and a predetermined portion of said drain polycrystalline silicon 34 is exposed by etching whereby window 64 is formed and a bit line is selectively formed. In the above description, in case of etching for forming the window 64, drain polycrystalline silicon 34 can prevent the drain diffusion region 40 from being damaged. In addition, said bit line 66 may be either silicide of W or Ti, or polycrystalline silicon.

As described above, according to the present invention, drain and source polycrystalline silicons are formed on the surface of substrate, wherein whenever an etching process is used for forming a storage poly and a bit line, the drain and source diffusion regions can prevent the damage caused by etching and there is an other advantage in that generation of leakage current can be prevented.

It will be appreciated that the present invention is not restricted to the particular embodiment that has been described hereinbefore, and that variations and modifications may be made therein without departing from the spirit and scope of the invention as defined in the appended claims and equivalents thereof.

What is claimed is:

1. A method of manufacturing a DRAM cell having a stacked capacitor, comprising the steps of:

forming first and second field oxide films on a semiconductor substrate of a first conductive type, forming a channel stopper of said first conductive type on the low portion of the first field oxide film, and forming a polycrystalline silicon doped with impurities of a second conductive type and a nitride film in order;

dividing said polycrystalline silicon into drain and source polycrystalline silicon regions, and simultaneously forming a gate oxide film on the surface of said substrate between said drain and source polycrystalline silicon regions, and drain and source diffusion regions of the second conductive type and forming a gate electrode on a top portion of the gate oxide film;

forming a first insulating film on an upper surface of said nitride film and the gate electrode, and forming a window at a predetermined portion of the top portion of said source polycrystalline silicon and a storage poly contacting with the source polycrystalline silicon exposed through said window;

forming a dielectric layer which becomes a dielectric substance of the stacked capacitor and a plate poly on the top portion of said storage poly; and forming a second insulating film on the top portion of said first insulating film and the plate poly and forming a window at a predetermined portion of the top portion of said drain polycrystalline silicon region, and a bit line contacting with the drain polycrystalline silicon region exposed through said window, wherein said polycrystalline silicon doped with impurities of the second conductive type and said nitride film are deposited over an entire area of the semiconductor substrate and the first and second field oxide films, said storage poly is contacted with the source polycrystalline silicon superposed on the first field oxide film, and said bit line is contacted with the drain polycrystalline silicon superposed on the second field oxide film.

* * * * *